(12) United States Patent
Yoon

(10) Patent No.: US 12,520,489 B2
(45) Date of Patent: Jan. 6, 2026

(54) SEMICONDUCTOR DEVICE INCLUDING A VERTICAL CHANNEL PILLAR HAVING A HYBRID CHANNEL LAYER

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 627 days.

(21) Appl. No.: 17/838,334

(22) Filed: Jun. 13, 2022

(65) Prior Publication Data

US 2023/0200070 A1    Jun. 22, 2023

(30) Foreign Application Priority Data

Dec. 21, 2021    (KR) .................... 10-2021-0183695

(51) Int. Cl.
*H10B 43/27*    (2023.01)

(52) U.S. Cl.
CPC .................... *H10B 43/27* (2023.02)

(58) Field of Classification Search
CPC ........ H10B 43/27; H10B 43/30; H10B 43/40; H10B 43/50; H10D 30/693; H10D 64/037
See application file for complete search history.

(56) References Cited

U.S. PATENT DOCUMENTS

| | | | |
|---|---|---|---|
| 2016/0268274 A1* | 9/2016 | Kawai | H10B 43/27 |
| 2019/0305095 A1* | 10/2019 | Choi | H10D 64/252 |
| 2020/0075629 A1* | 3/2020 | Park | H10B 43/27 |
| 2022/0020766 A1* | 1/2022 | Jang | H10B 41/40 |
| 2022/0416052 A1* | 12/2022 | Kang | H10D 30/6743 |
| 2023/0165002 A1* | 5/2023 | Lim | H10B 41/35 257/314 |

FOREIGN PATENT DOCUMENTS

| | | |
|---|---|---|
| KR | 10-2005533 B1 | 7/2019 |
| KR | 10-2022-0009015 A | 1/2022 |

* cited by examiner

*Primary Examiner* — William B Partridge
*Assistant Examiner* — Erik A. Anderson
(74) *Attorney, Agent, or Firm* — IP & T GROUP LLP

(57) ABSTRACT

A semiconductor device includes a word line stack over a substrate, the word line stack including a plurality of interlayer insulating layers and a plurality of word lines alternatively stacked, and a vertical channel pillar vertically passing through the word line stack. The vertical channel pillar includes a core insulating layer, a channel layer surrounding a side surface of the core insulating layer, and a memory layer surrounding a side surface of the channel layer. The channel layer includes a silicide channel layer and a silicon channel layer surrounding a side surface of the silicide channel layer.

20 Claims, 26 Drawing Sheets

SEMICONDUCTOR DEVICE INCLUDING A VERTICAL CHANNEL PILLAR HAVING A HYBRID CHANNEL LAYER

CROSS-REFERENCE TO RELATED APPLICATIONS

The present application claims priority to Korean Patent Application No. 10-2021-0183695, filed on Dec. 21, 2021, which is herein incorporated by reference in its entirety.

BACKGROUND

1. Field

The present disclosure provides a semiconductor device including a vertical channel pillar having a hybrid channel layer and a method of manufacturing the semiconductor device including the vertical channel pillar having the hybrid channel layer.

2. Description of the Related Art

A semiconductor device including a vertical channel pillar having a silicon channel layer has been proposed.

SUMMARY

An embodiment of the present disclosure provides a semiconductor device. The semiconductor device includes a word line stack over a substrate, the word line stack including a plurality of interlayer insulating layers and a plurality of word lines alternatively stacked, and a vertical channel pillar vertically passing through the word line stack. The vertical channel pillar includes a core insulating layer, a channel layer surrounding a side surface of the core insulating layer, and a memory layer surrounding a side surface of the channel layer. The channel layer includes a silicide channel layer and a silicon channel layer surrounding a side surface of the silicide layer.

An embodiment of the present disclosure provides a method of manufacturing a semiconductor device. The method includes forming an insulating layer stack over a substrate, forming a channel hole vertically passing through the insulating layer stack, forming a memory layer over an inner wall of the channel hole, forming a channel layer over an inner wall of the memory layer, and forming a core insulating layer over an inner wall of the channel layer. Forming the channel layer includes forming a silicon channel layer over the inner wall of the memory layer in the channel hole, forming a first filling metal over the silicon channel layer in a first region of the channel hole, forming a first preliminary silicide layer embedded in the silicon channel layer by performing a first preliminary silicidation process, removing the remaining first filling metal, forming a first filling insulating material in the first region of the channel hole, transforming the first preliminary silicide layer to a silicide channel layer by performing a main silicidation process, removing the first filling insulating layer, and forming a core insulating layer in the channel hole.

An embodiment of the present disclosure includes a method of manufacturing a semiconductor device. The method includes forming an insulating layer stack over a substrate, forming a channel hole vertically passing through the insulating layer stack, forming a memory layer in an inner wall of the channel hole, forming a channel layer over an inner wall of the memory layer and forming a core insulating layer over an inner wall of the channel layer to fill the channel hole. Forming the channel layer includes forming a silicon channel layer over the inner wall of the memory layer in the channel hole, forming a filling metal over an inner wall of the silicon channel layer, forming a silicide channel layer embedded in the silicon channel layer by performing a silicidation process, removing the remaining filling metal, and forming a core insulating layer over an inner wall of the silicide channel layer to fill the channel hole.

Embodiments of the present invention relate generally to a semiconductor device including a stack of alternating conductive and insulating layers formed over a substrate, a common electrode layer disposed between the stack and the substrate, and a channel pillar passing through the stack to directly contact the common electrode layer. The channel pillar may include a core insulating layer, a hybrid channel layer and a memory layer. The hybrid channel layer may include a silicon channel layer and a silicide channel layer formed inside the silicon channel layer with one side surface of the hybrid channel layer which is adjacent to the memory layer consisting exclusively of the silicon channel layer and an opposite side surface of the hybrid channel layer which is adjacent to the core insulating layer consisting of alternating regions of the silicon channel layer and the silicide channel layer.

DETAILED DESCRIPTION

Figure 1A:
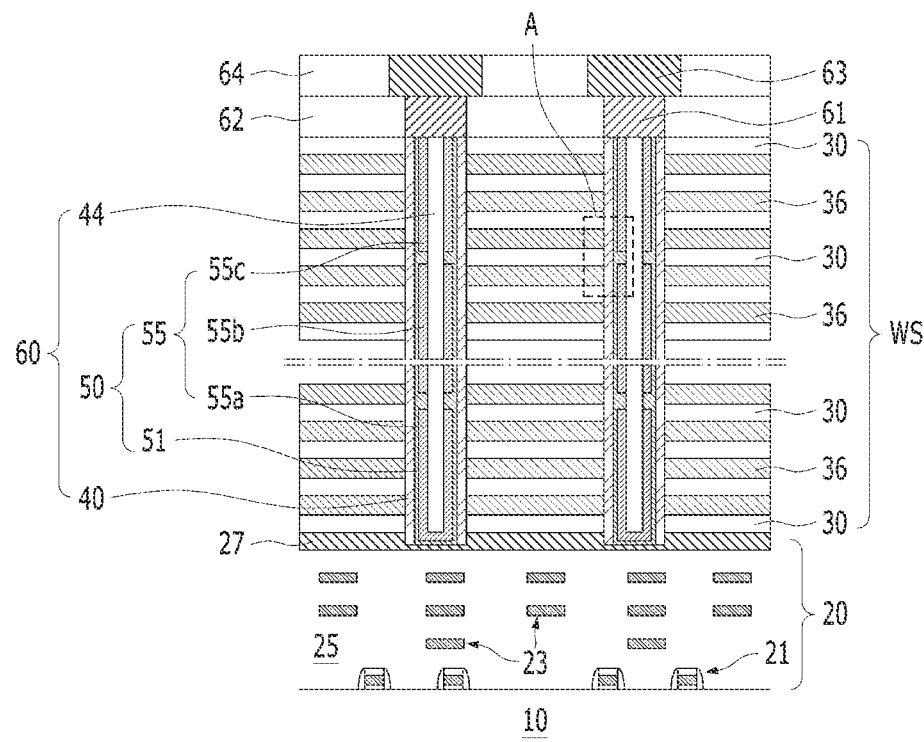
FIG. 1A is a longitudinal sectional view schematically illustrating a semiconductor device according to an embodiment of the present disclosure.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

Other expressions that explain the relationship between elements, such as "between", "directly between", "adjacent to" or "directly adjacent to" should be construed in the same way.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer.

Embodiments of the present disclosure provide a vertical channel pillar having a hybrid channel layer.

Embodiments of the present disclosure provide a method of forming a hybrid channel layer.

Embodiments of the present disclosure provide a semiconductor device including a vertical channel pillar having a hybrid channel layer.

Embodiments of the present disclosure provide a method of manufacturing a semiconductor device including a vertical channel pillar having a hybrid channel layer.

Figure 1B:
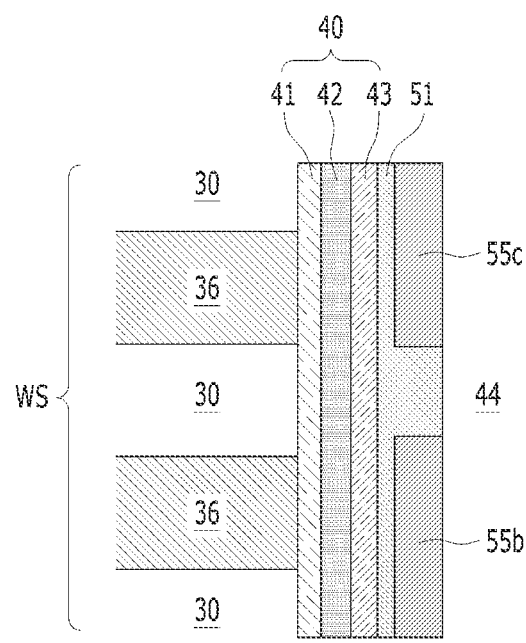
FIG. 1B illustrates an enlarged view of an area A of FIG. 1A.

FIG. 1A is a longitudinal sectional view schematically illustrating a semiconductor device according to an embodiment of the present disclosure, and FIG. 1B illustrates an enlarged view of an area A of FIG. 1A.

Referring to FIGS. 1A and 1B, a semiconductor device according to an embodiment of the present disclosure may include a logic circuit layer 20 disposed over a substrate 10, and a word line stack WS and a vertical channel pillar 60 disposed over the logic circuit layer 20.

The semiconductor device may further include a contact plug 61, a lower interconnection insulating layer 62, a bit line 63, and an upper interconnection insulating layer 64.

The substrate 10 may include a semiconducting material. For example, the substrate 10 may include one of a single crystal silicon wafer, an epitaxially grown silicon layer, a silicon-on-insulator (SOI), a compound semiconductor, or other semiconducting material layer.

The logic circuit layer 20 may include a transistor 21, a logic interconnection 23, a logic insulating layer 25, and a common electrode layer 27. The transistor 21 may include a gate electrode disposed over the substrate 10 and source/drain electrodes formed in the substrate 10. The logic interconnection 23 may include multiple metal layers. The logic insulating layer 25 may surround the transistor 21 and the logic interconnection 23 to insulate them from each other. The common electrode layer 27 may be disposed at an uppermost portion of the logic circuit layer 20. The common electrode layer 27 may include a polycrystalline silicon layer doped with N-type ions, a metal such as tungsten (W), a metal compound such as titanium nitride (TiN), or a metal silicide. In a top view, the common electrode layer 27 may have a rail shape or a plate shape.

The word line stack WS may include interlayer insulating layers 30 and word lines 36 that are alternately stacked in a vertical direction over the logic circuit layer 20. The interlayer insulating layers 30 may insulate the common electrode layer 27 and the word lines 36 in a vertical direction. The interlayer insulating layers 30 may include, for example, silicon oxide ($SiO_2$). The word lines 36 may include a conductive material. For example, the word lines 36 may include a barrier metal such as titanium nitride (TiN) and a metal such as tungsten (W). In an embodiment, each of the word lines 36 may include a word line electrode including a metal such as tungsten and a barrier layer including a metal barrier such as titanium nitride surrounding at least partially the word line electrode.

The vertical channel pillar 60 may vertically pass through the word line stack WS to be electrically connected to the common electrode layer 27. The vertical channel pillars 60 may protrude into the common electrode layer 27 but may not pass through the common electrode layer 27. The vertical channel pillar 60 may include a memory layer 40, a hybrid channel layer 50, and a core insulating layer 44. The hybrid channel layer 50 may surround outer and lower surfaces of the core insulating layer 44. The memory layer 40 may surround an outer surface of the hybrid channel layer 50. The core insulating layer 44 may have a pillar shape. The memory layer 40 and the hybrid channel layer 50 may have a cylinder shape. The memory layer 40 may include a blocking insulating layer 41, a charge trap layer 42, and a tunneling insulating layer 43. The tunneling insulating layer 43 may abut the hybrid channel layer 50. The charge trap layer 42 may surround an outer side surface of the tunneling insulating layer 43. The blocking insulating layer 41 may surround an outer side surface of the charge trap layer 42. The tunneling insulating layer 43 may include a silicon oxide ($SiO_2$) layer. The charge trap layer 42 may include a silicon nitride (SiN) layer. The blocking insulating layer 41 may include an insulating material having a higher work function than the tunneling insulating layer 43, such as aluminum oxide ($Al_2O_3$). In an embodiment, the blocking insulating layer 41 may include a silicon oxide ($SiO_2$) layer and an aluminum oxide ($Al_2O_3$) layer. The blocking insulating layer 41, the charge trapping layer 42, and the tunneling insulating layer 43 may each have a cylinder shape.

The hybrid channel layer 50 may include a silicon channel layer 51 and a silicide channel layer 55. The silicon channel layer 51 may have a cylinder shape having sidewalls extending in a vertical direction. The silicide channel layer 55 may be embedded in an inner wall of the silicon channel layer 51. The silicon channel layer 51 may be formed to surround an outer wall of the silicide channel layer 55. The silicide channel layer 55 may include a plurality of unit silicide layers 55a, 55b, and 55c. For example, the silicide channel layer 55 may include a lower silicide layer 55a, an intermediate silicide layer 55b, and an upper silicide layer 55c. The lower silicide layer 55a, the intermediate silicide layer 55b, and the upper silicide layer 55c may be vertically spaced apart from each other. Each of the plurality of silicide layers 55a, 55b, and 55c may have a ring shape or a cylinder shape. In an embodiment, the silicide channel layer 55 may be partially embedded in the silicon channel layer 51. For example, a first portion of the silicide channel layer 55 may be embedded in the silicon channel layer 51, and a second portion of the silicide channel layer 55 may be embedded in the core insulating layer 44. The silicide channel layer 55 may be spaced apart from the memory layer 40 in a horizontal direction. For example, the lower silicide layer 55a, the intermediate silicide layer 55b, and the upper silicide layer 55c of the silicide channel layer 55 may be spaced apart from the tunneling insulating layer 43 in the horizontal direction to not be in contact with the tunneling insulating layer 43. The silicon channel layer 51 may be between the memory layer 40 and the silicide channel layer 55. The silicide layers 55a, 55b, and 55c of the silicide channel layer 55 may include at least one of palladium silicide (PdSi), nickel silicide (NiSi), or aluminum silicide (AlSi). In another embodiment, the silicide layers 55a, 55b, and 55c of the silicide channel layer 55 may include at least one of titanium silicide (TiSi), cobalt silicide (CoSi), hafnium silicide (HfSi), zirconium silicide (ZrSi), or another metal silicide.

The lower interconnection insulating layer 62 may be formed over the word line stack WS and the vertical channel pillars 60. The contact plugs 61 may pass through the lower interconnection insulating layer 62 to electrically connect the vertical channel pillars 60 with the bit lines 63. The contact plugs 61 may have a stud shape. The contact plugs 61 may have a pillar shape. The upper interconnection insulating layer 64 may be formed over the lower interconnection insulating layer 62 and the contact plugs 61. The bit lines 63 may be connected to the contact plugs 61 and may have a shape of parallel lines in a horizontal direction. The lower interconnection insulating layer 62 and the upper interconnection insulating layer 64 may include, for example, silicon oxide ($SiO_2$). The contact plugs 61 and the bit lines 63 may include, for example, a metal such as tungsten (W) or a metal nitride such as titanium nitride (TiN).

Figure 2A:
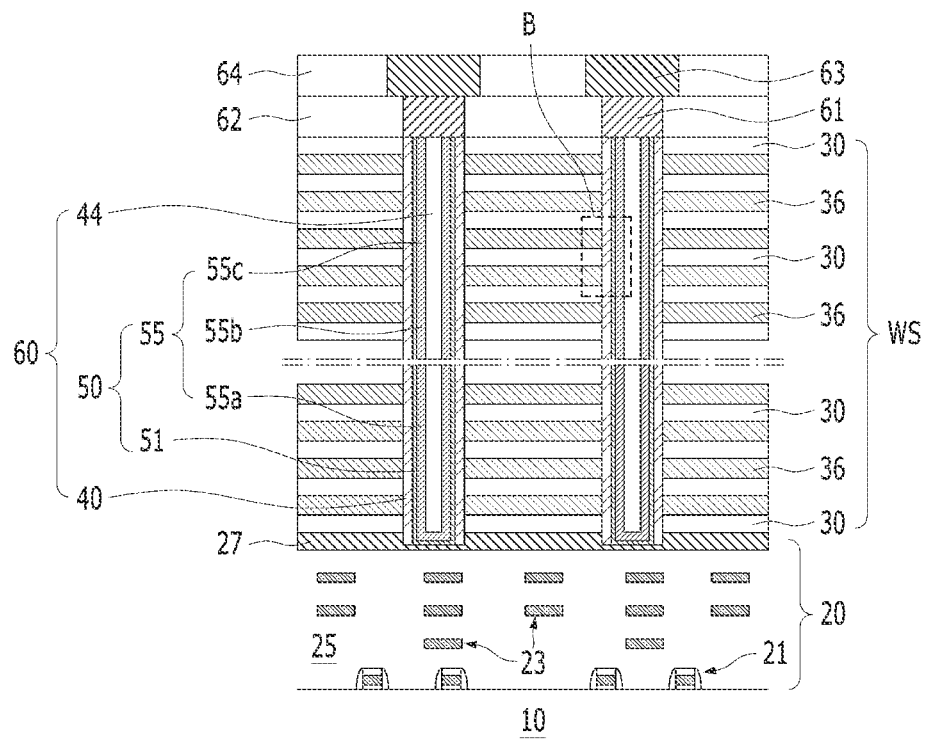
FIG. 2A is a longitudinal sectional view schematically illustrating a semiconductor device according to an embodiment of the present disclosure.
Figure 2B:
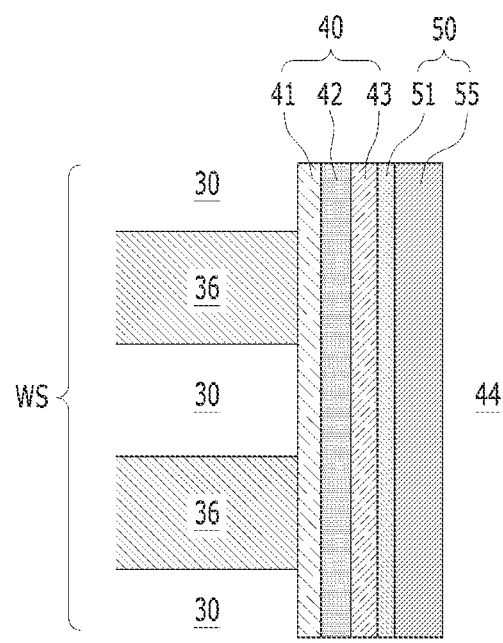
FIG. 2B illustrates an enlarged view of an area B of FIG. 2A.

FIG. 2A is a longitudinal sectional view schematically illustrating a semiconductor device according to an embodiment of the present disclosure, and FIG. 2B illustrates an enlarged view of an area B of FIG. 2A. Referring to FIGS. 2A and 2B, a semiconductor device according to an embodiment of the present disclosure may include a logic circuit layer 20 disposed over a substrate 10, a word line stack WS disposed over the logic circuit layer 20, and a vertical channel pillar 60 vertically passing through the word line stack WS. The semiconductor device may further include a contact plug 61, a lower interconnection insulating layer 62, a bit line 63, and an upper interconnection insulating layer 64.

The vertical channel pillar 60 may include a memory layer 40, a hybrid channel layer 50, and a core insulating layer 44. The hybrid channel layer 50 may include a silicon channel layer 51 and a silicide channel layer 55. Compared to the semiconductor device illustrated in FIGS. 1A and 1B, the silicide channel layer 55 in the embodiment of FIG. 2A may be a single layer continuous in a vertical direction. For example, the lower silicide layer 55a, the intermediate silicide layer 55b, and the upper silicide layer 55c shown in FIGS. 1A and 1B may be continuously connected to each other forming the single silicide layer 55 as shown in FIG. 2A and FIG. 2B. Each of the silicon channel layer 51 and the silicide channel layer 55 may have a cylinder shape. Other elements of FIG. 2A need not be described again since they have been described with reference to FIGS. 1A and 1B.

Figure 3:
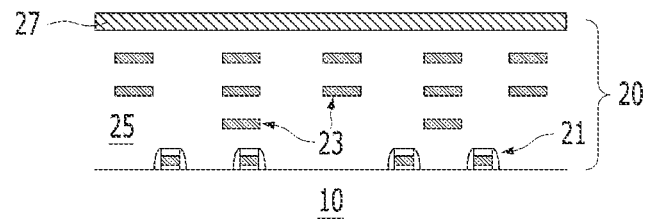
FIGS. 3 to 18 are schematic views describing a method of manufacturing a semiconductor device according to an embodiment of the present disclosure.

FIGS. 3 to 18 are schematic views describing a method of manufacturing a semiconductor device according to an embodiment of the present disclosure. Referring to FIG. 3, a method of forming a semiconductor device according to an embodiment of the present disclosure may include forming a logic circuit layer 20 over a substrate 10. Forming the logic circuit layer 20 may include forming transistors 21, logic interconnections 23, a logic insulating layer 25, and a common electrode layer 27 over the substrate 10. Forming the common electrode layer 27 may include forming at least one of an N-doped silicon layer, a metal layer such as tungsten (W), a metal compound layer such as titanium nitride (TiN), or a metal silicide layer over the logic insulating layer 25.

Figure 4:
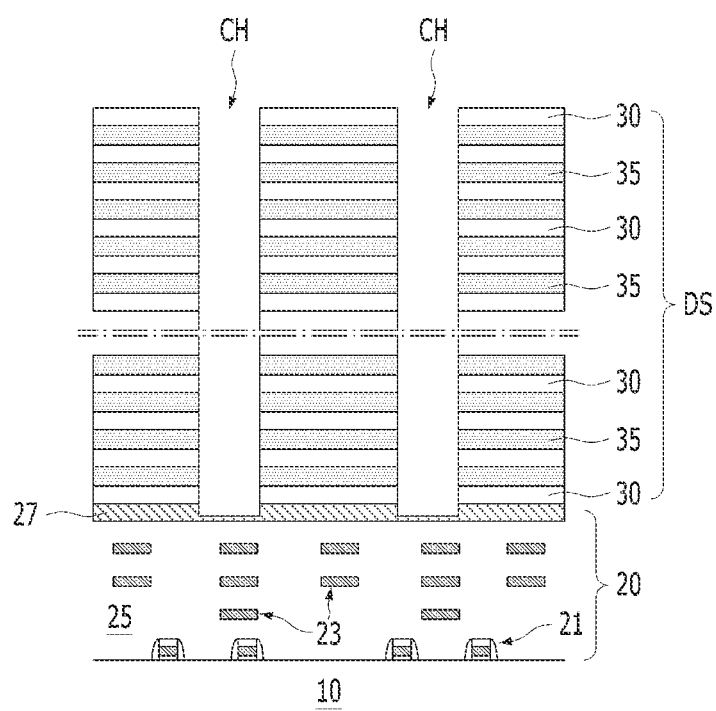

Referring to FIG. 4, the method may further include forming an insulating layer stack DS over the logic circuit layer 20. The insulating layer stack DS may be formed over the common electrode layer 27. The method may further include channel holes CH that vertically pass through the insulating layer stack DS to expose the common electrode layer 27. Forming the insulating layer stack DS may include alternately stacking interlayer insulating layers 30 and sacrificial insulating layers 35 over the common electrode layer 27 by performing a plurality of deposition processes. The interlayer insulating layers 30 may include, for example, silicon oxide ($SiO_2$). The sacrificial insulating layers 35 may include silicon nitride (SiN). Forming the channel holes CH may include forming a mask pattern over the insulating layer stack DS and performing a selective etching process using the mask pattern as an etching mask. Thereafter, the mask pattern may be removed.

Figure 5A:
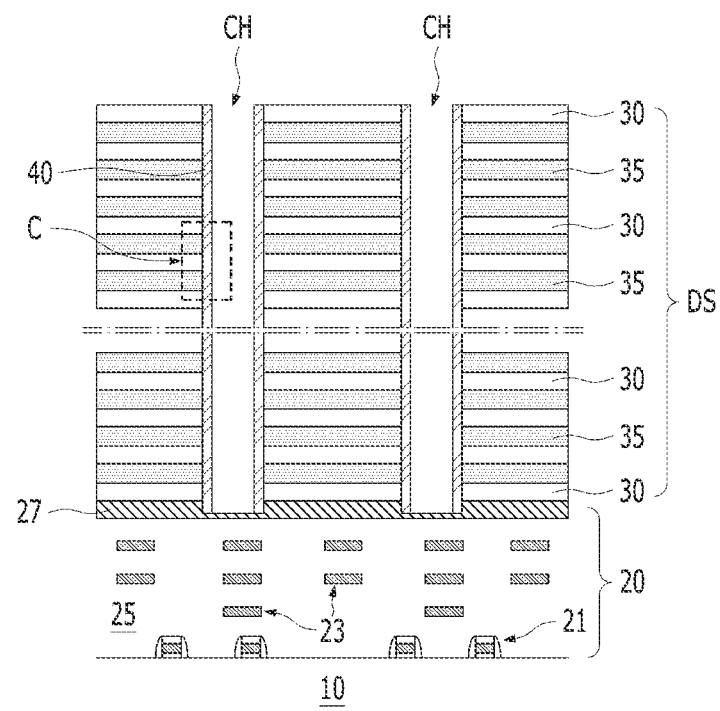
Figure 5B:
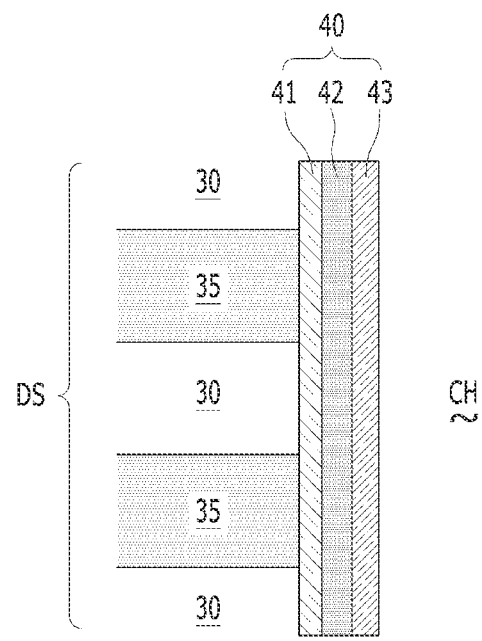

FIG. 5B illustrates an enlarged view of an area C of FIG. 5A. Referring to FIGS. 5A and 5B, the method may further include forming the memory layer 40 over an inner wall of the channel hole CH. Forming the memory layer 40 may include conformally forming a blocking insulating layer 41, a charge trap layer 42, and a tunneling insulating layer 43 over the inner wall of the channel hole CH. The blocking insulating layer 41 may surround a side surface of the charge trap layer 42, and the charge trap layer 42 may surround a side surface of the tunneling insulating layer 43. The blocking insulating layer 41 may include an insulating material having a higher work function than the tunneling insulating layer 43, such as aluminum oxide ($Al_2O_3$). In an embodiment, the blocking insulating layer 41 may be a double layer including a silicon oxide ($SiO_2$) layer and an aluminum oxide ($Al_2O_3$) layer. The charge trap layer 42 may include a silicon nitride (SiN) layer. The tunneling insulating layer 43 may include a silicon oxide layer ($SiO_2$). The memory layer 40 may not be formed over a surface of the common electrode layer 27 which is exposed by the channel hole CH.

Figure 6A:
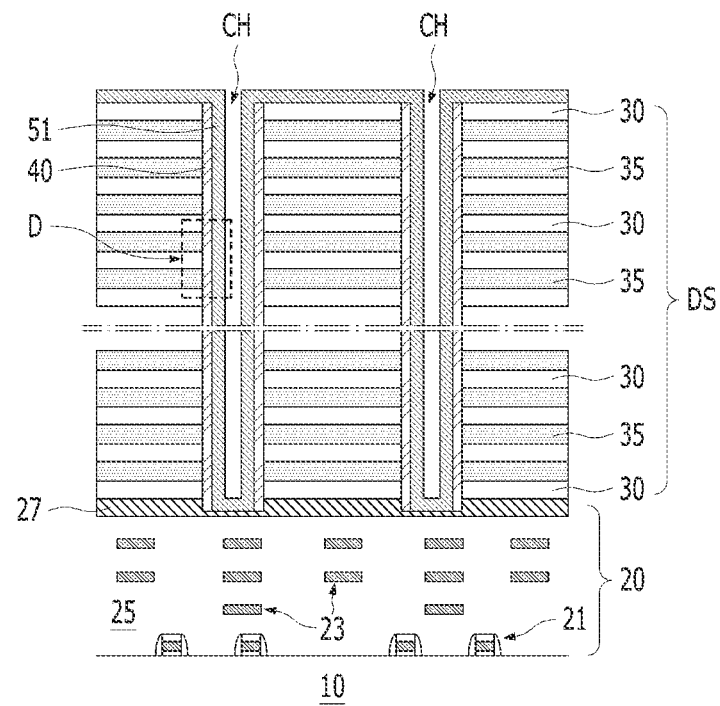
Figure 6B:
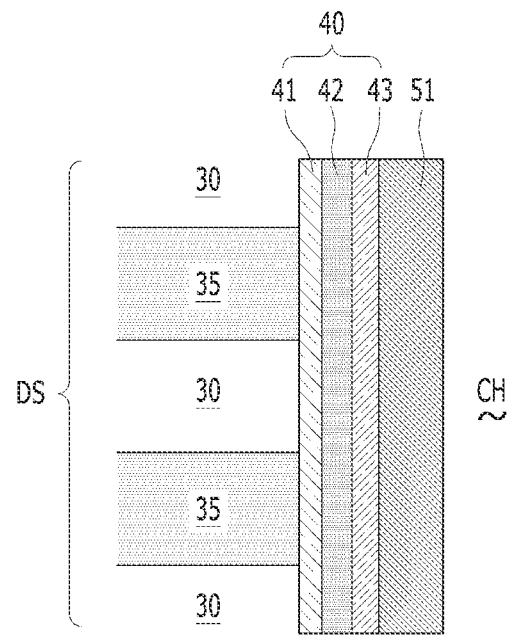

FIG. 6B illustrates an enlarged view of an area D of FIG. 6A. Referring to 6A and 6B, the method may further include conformally forming a silicon channel layer 51 over the inner wall of the channel hole CH. Forming the silicon channel layer 51 may include conformally forming polycrystalline silicon or amorphous silicon over the memory layer 40 by performing a deposition process such as an atomic layer deposition (ALD) process. The silicon channel layer 51 may also be formed over a surface of the common electrode layer 27 which is exposed by the channel hole CH. The silicon channel layer 51 may also be formed over the uppermost interlayer insulating layer 30 of the insulating layer stack DS. The memory layer 40 may surround a side surface of the silicon channel layer 51.

Figure 7:
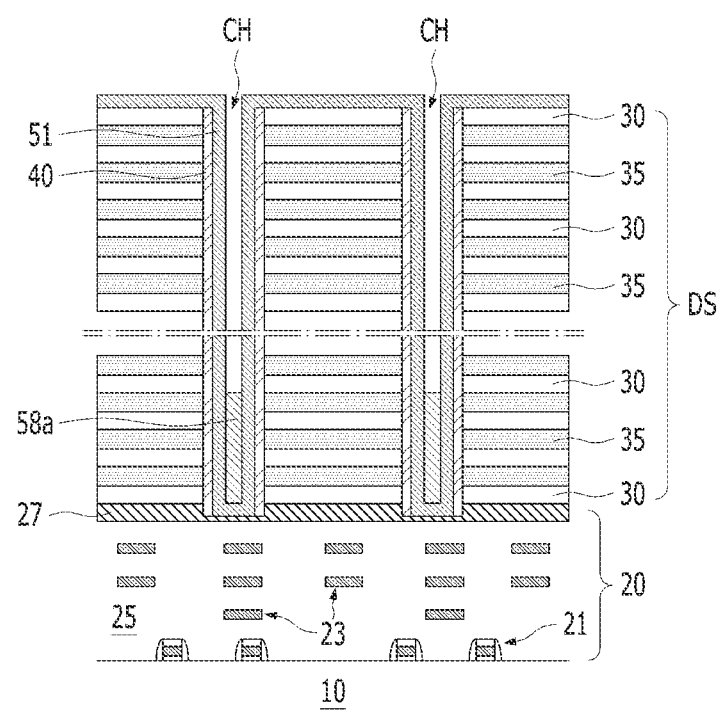

Referring to FIG. 7, the method may further include forming a lower filling metal 58a in contact with the silicon channel layer 51 to fill a lower region inside the channel hole CH. Forming the lower filling metal 58a may include performing a deposition process such as a PVD (Physical Vapor Deposition) process and an etching process. The PVD process may include at least one of an evaporative deposition, an ion plating, a pulsed laser deposition, and a sputter deposition. The lower filling metal 58a may include one of palladium (Pd), nickel (Ni), aluminium (Al), or other metals having high diffusivity or high permeability. In another embodiment, the lower filling metal 58a may include, for example, a metal having low diffusivity or low permeability, such as titanium (Ti) or cobalt (Co).

Figure 8A:
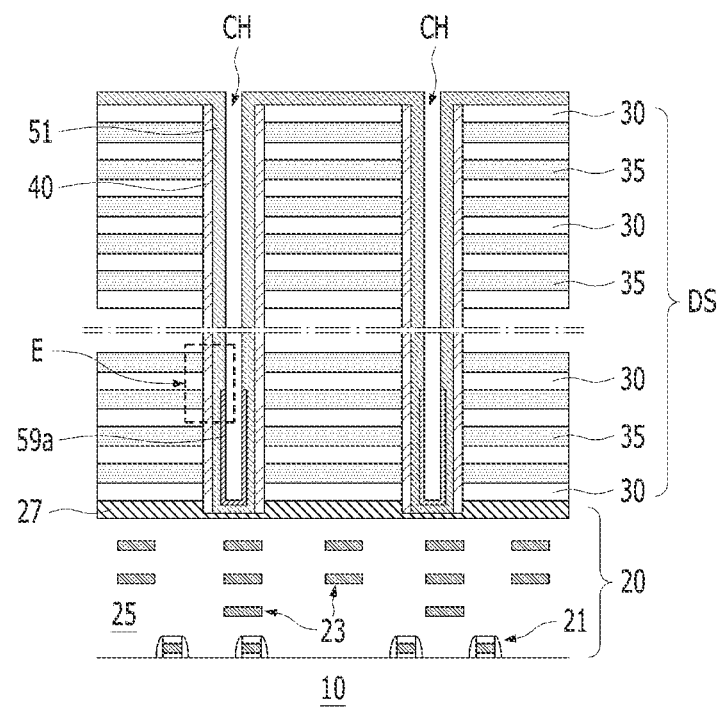
Figure 8B:
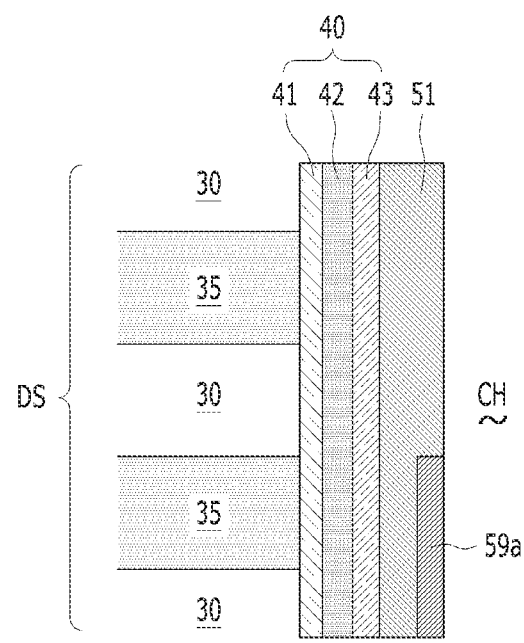

FIG. 8B illustrates an enlarged view of an area E of FIG. 8A. Referring to FIGS. 8A and 8B, the method may further include silicidating a part of the lower portion of the silicon channel layer 51 by performing a first preliminary silicidation process. A lower preliminary silicide layer 59a may be formed in the portion of the lower portion of the silicon channel layer 51. Since the lower filling metal 58a has high diffusivity or high permeability, the lower preliminary silicide layer 59a may be formed in the silicon channel layer 51. The first preliminary silicidation process may be performed at a temperature of about 400° C. In another embodiment, the lower preliminary silicide layer 59a may be formed both inside and outside the silicon channel layer 51. For example, silicon atoms in the silicon channel layer 51 may diffuse into the lower filling metal 58a to transform the second preliminary silicide layer 51 to a part of the lower preliminary silicide layer 59a. Thereafter, the method may further include removing the remaining lower filling metal 58a.

Figure 9:
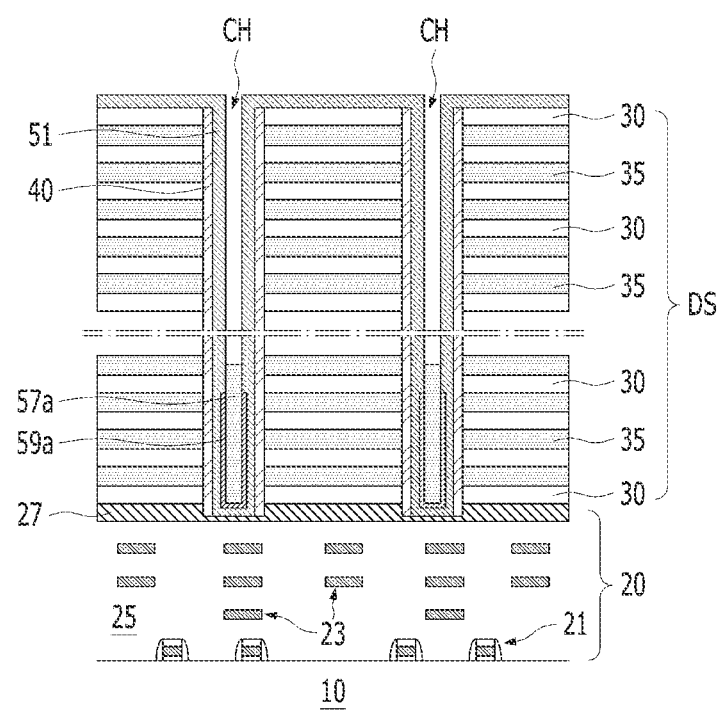

Referring to FIG. 9, the method may further include forming a lower filling insulating material 57a in a lower region of the channel hole CH from which the lower filling metal 58a is removed by performing a deposition process and an etching process. The lower filling insulating material 57a may include an insulating material that does not react to the silicidation process. For example, the lower filling insulating material 57a may include silicon nitride (SiN). An upper end of the lower filling insulating material 57a may be positioned at a higher level than an upper end of the lower preliminary silicide layer 59a.

Figure 10A:
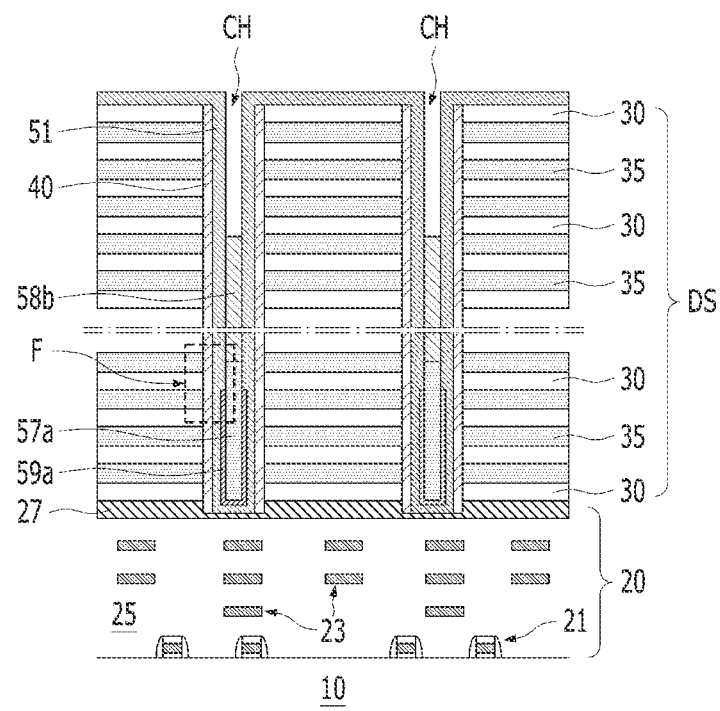
Figure 10B:
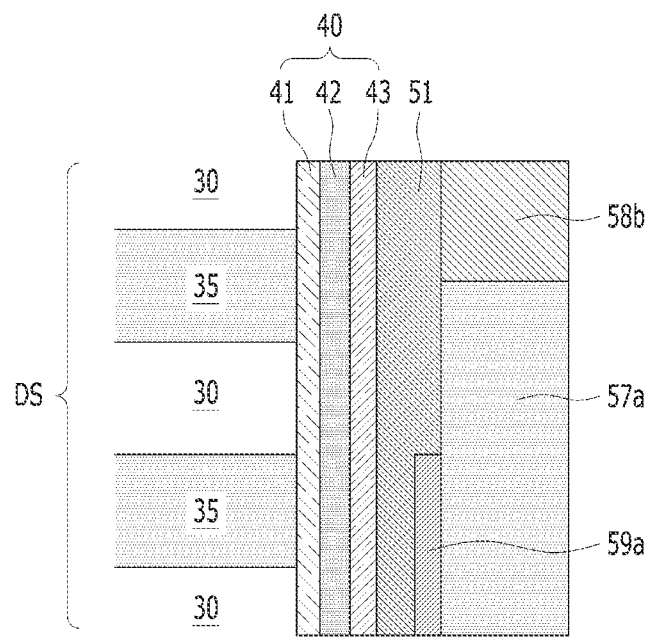

FIG. 10B illustrates an enlarged view of an area F of FIG. 10A. Referring to FIGS. 10A and 10B, the method may further include filling an intermediate filling metal 58b over the lower filling insulating material 57a in the channel hole CH. The intermediate filling metal 58b may include the same metal as the lower filling metal 58a. The intermediate filling metal 58b and the lower preliminary silicide layer 59a may be spaced apart from each other in the vertical direction, i.e., the direction of stacking of the interlayer insulating layers 30 and the sacrificial insulating layers 35. A lower end of the intermediate filling metal 58b may be positioned at a higher level than the upper end of the lower preliminary silicide layer 59a.

Figure 11A:
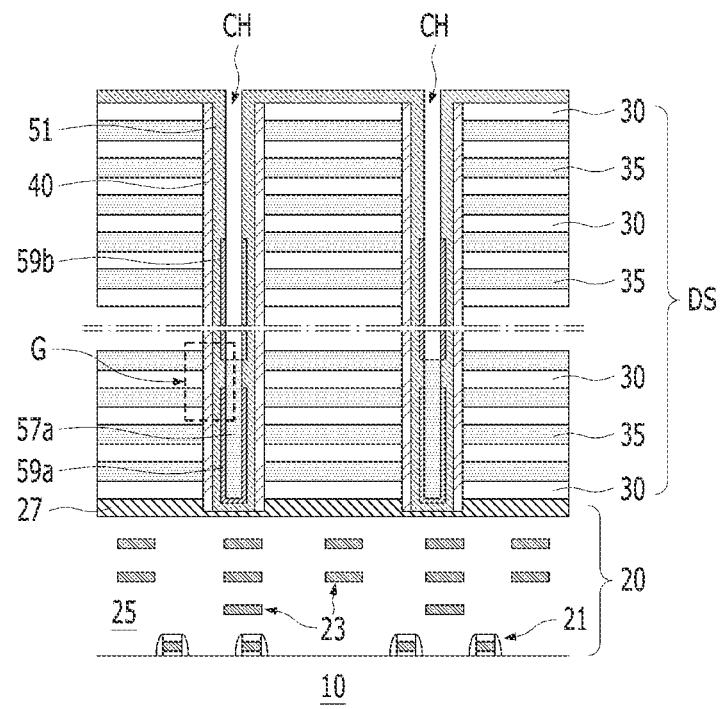
Figure 11B:
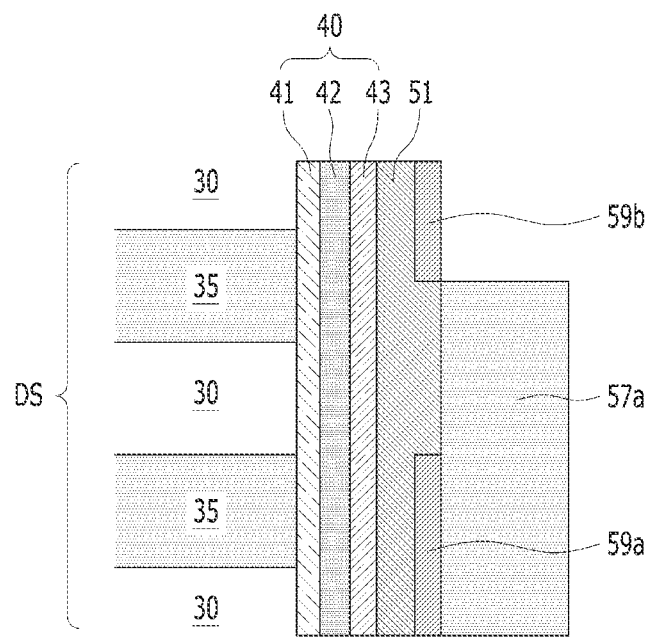

FIG. 11B illustrates an enlarged view of an area G of FIG. 11A. Referring to FIGS. 11A and 11B, the method may further include silicidating a part of an intermediate portion of the silicon channel layer 51 by performing a second preliminary silicidation process. The intermediate preliminary silicide layer 59b may be formed in an intermediate portion of the silicon channel layer 51. The lower preliminary silicide layer 59a and the intermediate preliminary silicide layer 59b may be vertically spaced apart from each other. The method may further include removing the remaining intermediate filling metal 58b after the second preliminary silicidation process is performed.

Figure 12:
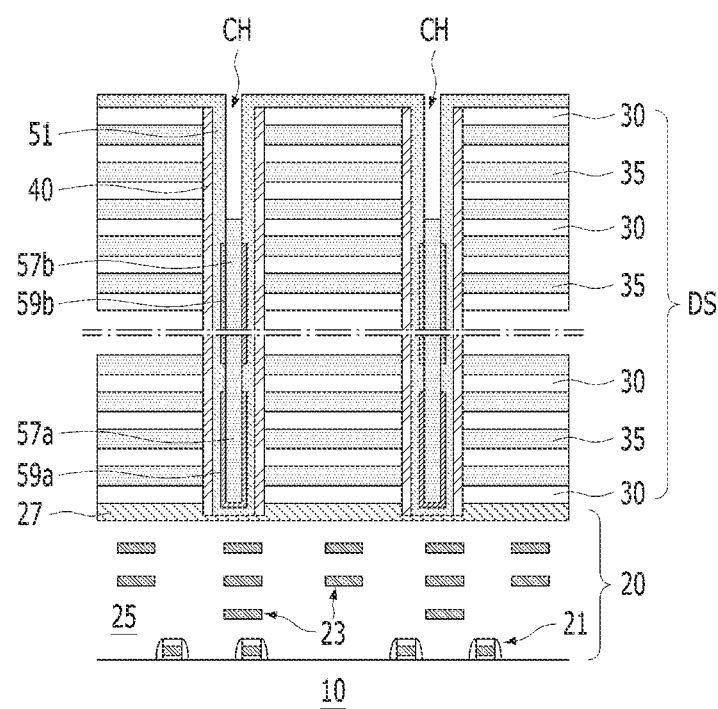

Referring to FIG. 12, the method may further include forming an intermediate filling insulating material 57b in the intermediate region of the channel hole CH from which the intermediate filling metal 58b has been removed. The intermediate filling insulating material 57b may include the same material as the lower filling insulating material 57a. An upper end of the intermediate filling insulating material 57b may be positioned at a higher level than an upper end of the intermediate preliminary silicide layer 59b.

Figure 13:
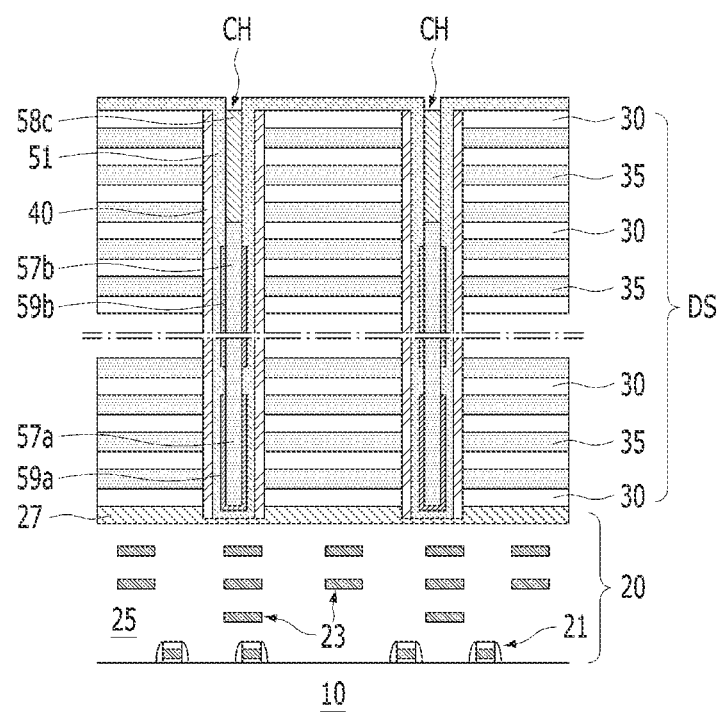

Referring to FIG. 13, the method may further include forming an upper filling metal 58c over the intermediate filling insulating material 57b of the channel hole CH. The upper filling metal 58c may include the same metal as the intermediate filling metal 58b.

Figure 14:
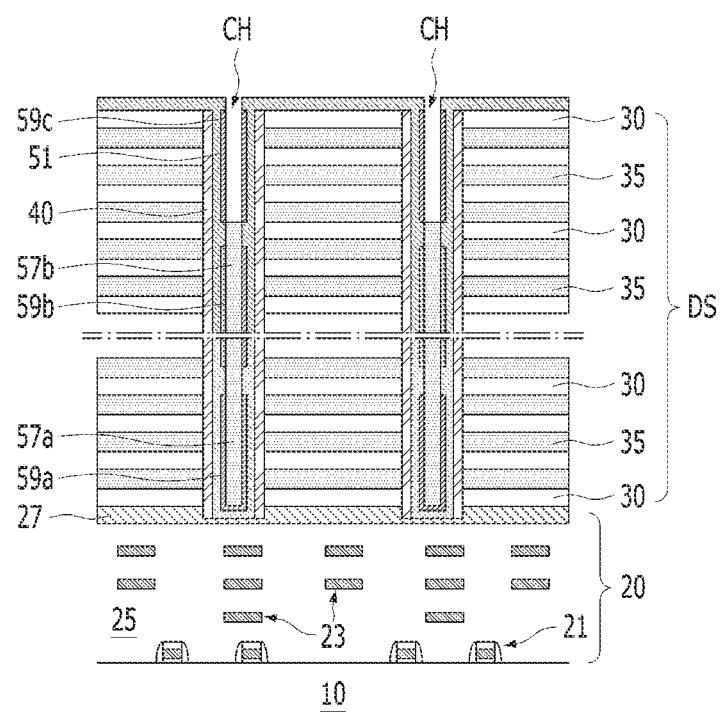

Referring to FIG. 14, the method may include silicidating a part of an upper portion of the silicon channel layer 51 by performing a third preliminary silicidation process. An upper preliminary silicide layer 59c may be formed in the part of the upper portion of the silicon channel layer 51. The intermediate preliminary silicide layer 59b and the upper preliminary silicide layer 59c may be vertically spaced apart from each other. The method may further include removing the remaining upper filling metal 58c after the completion of the third preliminary silicidation process.

Figure 15:
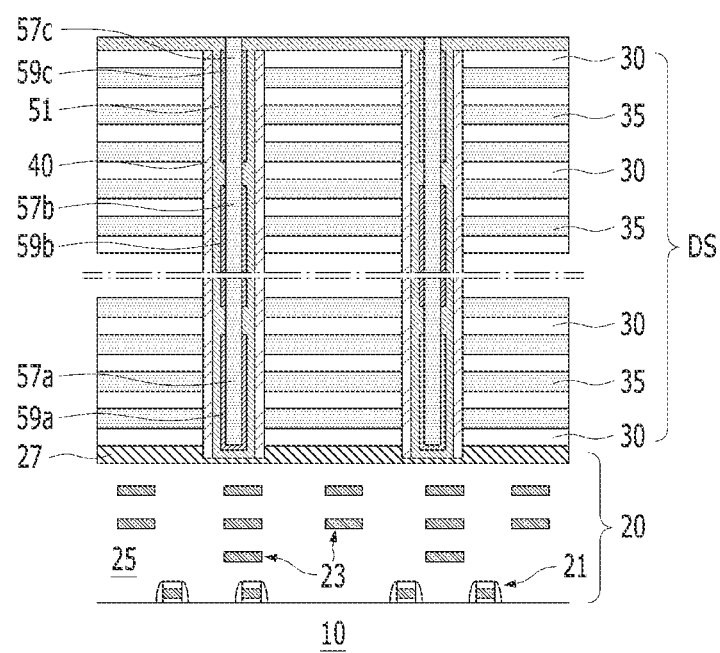

Referring to FIG. 15, the method may further include forming an upper filling insulating material 57c in an upper region of the channel hole CH from which the upper filling metal 58c has been removed. The upper filling insulating material 57c may include the same material as the intermediate filling insulating material 57b. An upper end of the upper filling insulating material 57c may be positioned at a higher level than an upper end of the upper preliminary silicide layer 59c.

Figure 16A:
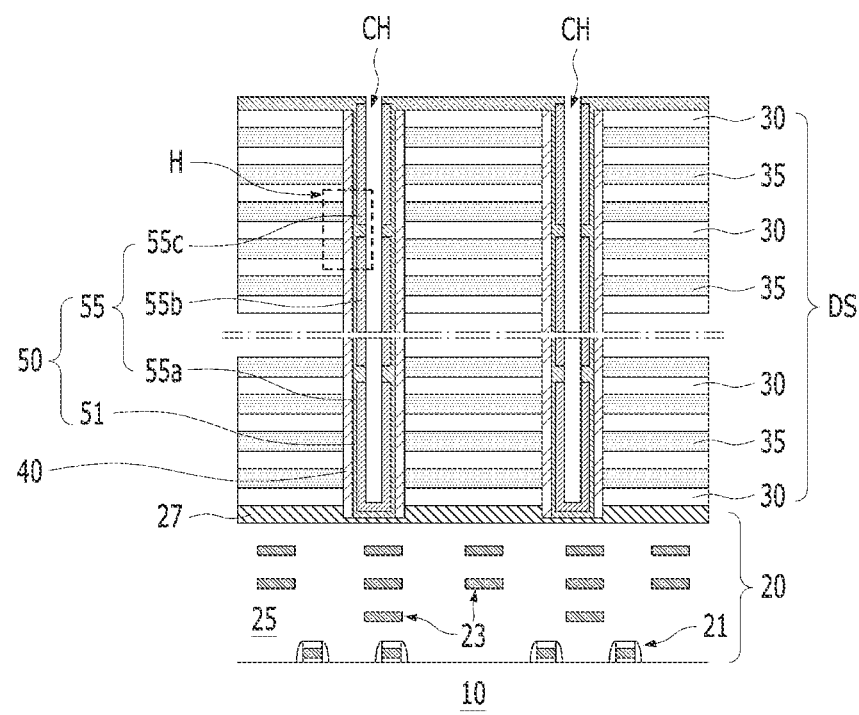
Figure 16B:
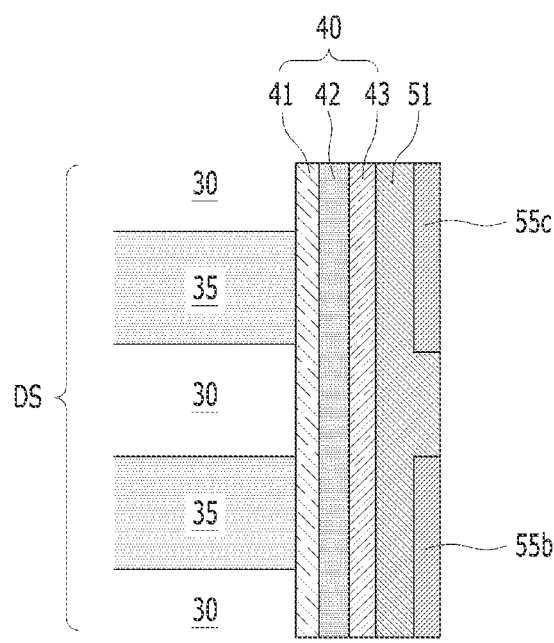

FIG. 16B illustrates illustrates an enlarged view of an area H of FIG. 16A. Referring to FIGS. 16A and 16B, the method may further include forming a lower silicide layer 55a, an intermediate silicide layer 55b, and an upper silicide layer 55c by performing a main silicidation process to expand and inflate the lower preliminary silicide layer 59a, the intermediate preliminary silicide layer 59b, and the upper preliminary silicide layer 59c. The lower silicide layer 55a, the intermediate silicide layer 55b, and the upper silicide layer 55c may be vertically spaced apart from each other. The lower silicide layer 55a, the intermediate silicide layer 55b, and the upper silicide layer 55c may have volumes greater than the lower preliminary silicide layer 59a, the intermediate preliminary silicide layer 59b, and the upper preliminary silicide layer 59c, respectively. The lower silicide layer 55a, the intermediate silicide layer 55b, and the upper silicide layer 55c may form a silicide channel layer 55. Accordingly, the silicon channel layer 51 and the silicide channel layer 55 may form the hybrid channel layer 50. The main silicidation process may be performed at a higher temperature than the first to third preliminary silicidation processes. For example, the main silicidation process may be performed at about 600° C. Thereafter, the method may further include removing the lower filling insulating material 57a, the intermediate filling insulating material 57b, and the upper filling insulating material 57c from the inside of the channel hole CH.

Figure 17:
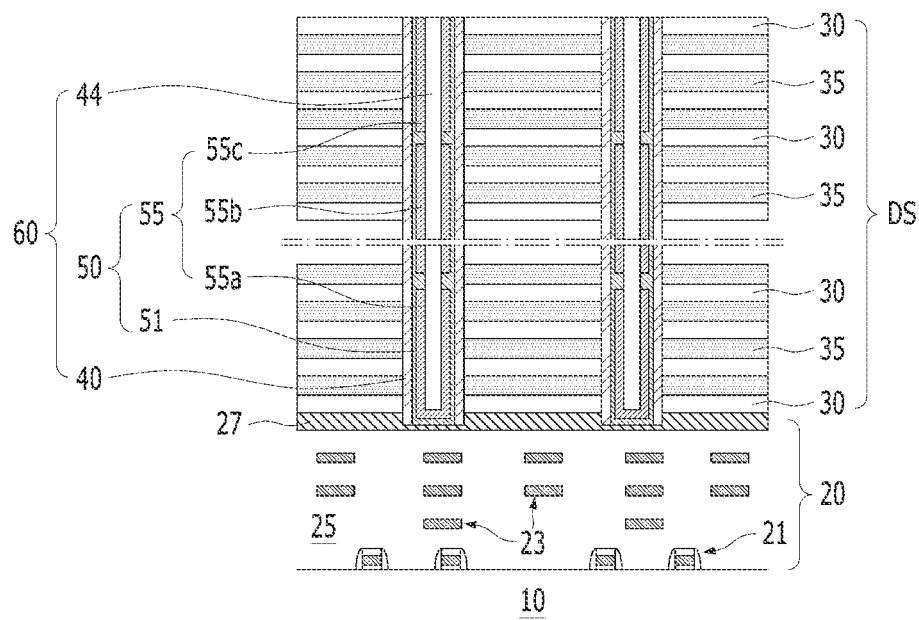

Referring to FIG. 17, the method may further include filling the channel holes CH by forming a core insulating layer 44 over an inner wall of the hybrid channel layer 50. The core insulating layer 44 may include, for example, silicon oxide ($SiO_2$). The method may further include filling the channel hole CH with the core insulating layer 44 and performing a chemical mechanical polishing (CMP) to coplanarize upper surfaces of the uppermost interlayer insulating layer 30, the memory layer 40, the hybrid channel layer 50, and the core insulating layer 44. The memory layer 40, the hybrid channel layer 50, and the core insulating layer 44 may form a vertical channel pillar 60.

Figure 18:
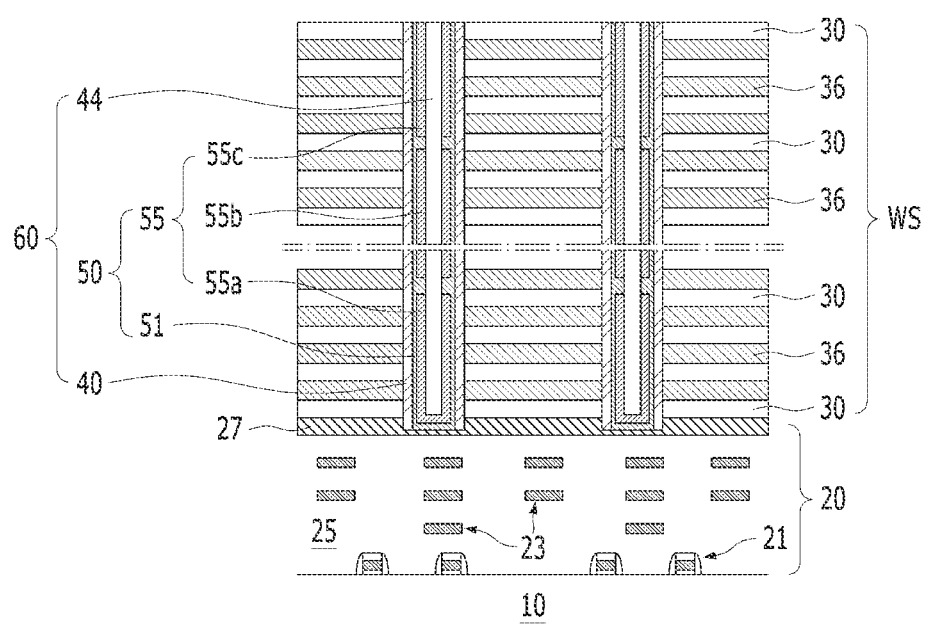

Referring to FIG. 18, the method may further include replacing the sacrificial insulating layers 35 with word lines 36 to form a word line stack WS. For example, the method may include removing the sacrificial insulating layers 35 by performing an etching process and forming the word lines 36 in the removed spaces. The word lines 36 may include, for example, a metal such as tungsten (W). In an embodiment, A barrier layer such as titanium nitride (TiN) may be further formed between the word lines 36 and the interlayer insulating layers 30 and between the word lines 36 and the memory layer 40.

Thereafter, referring to FIGS. 1A and 1B, the method may further include forming a contact plug 61 vertically aligned with the vertical channel pillar 60 over the word line stack WS and the vertical channel pillar 60, forming a lower interconnection insulating layer 62 surrounding outer surfaces of the contact plug 61, forming a bit line 63 over the contact plug 61, and forming an upper interconnection insulating layer 64 surrounding outer surfaces of the bit line 63. An upper surface of the contact plug 61 and an upper surface of the lower interconnection insulating layer 62 may be coplanar. An upper surface of the bit line 63 and an upper surface of the upper interconnection insulating layer 64 may be coplanar. The contact plug 61 and the bit lines 63 may include, for example, a metal, and the lower interconnection insulating layer 62 and the upper interconnection insulating layer 63 may include an insulating material such as silicon oxide ($SiO_2$).

Figure 19:
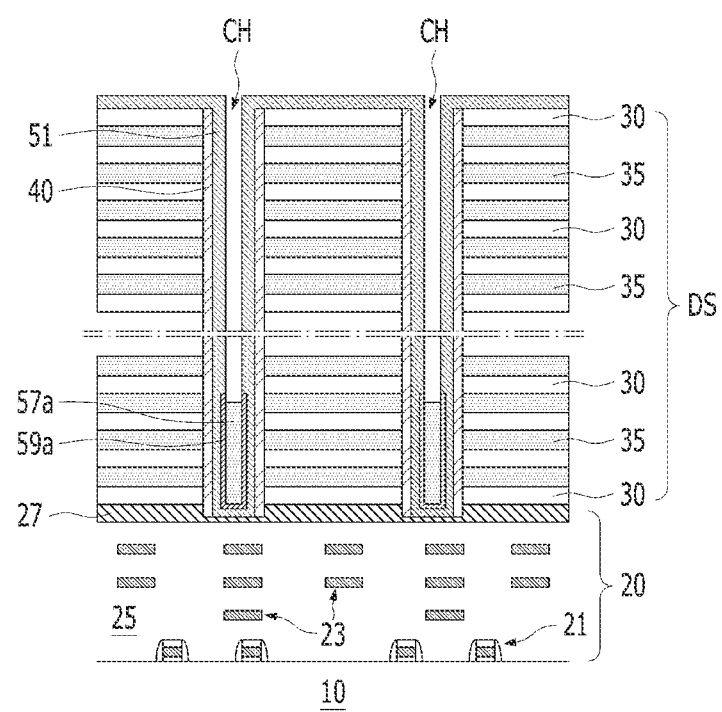
FIGS. 19 to 27 are schematic views describing a method of forming a semiconductor device according to an embodiment of the present disclosure.

FIGS. 19 to 27 are schematic views for describing a method of forming a semiconductor device according to an embodiment of the present disclosure. Referring to FIG. 19, in a method of forming a semiconductor device according to an embodiment of the present disclosure may include performing the processes described with reference to FIGS. 3 to 9 to form a lower filling insulating material 57a in a lower region in the channel hole CH. However, unlike the embodiment of FIG. 9, in the embodiment of FIG. 19, an upper end of the lower filling insulating material 57a may be positioned at a lower level than an upper end of the lower preliminary silicide layer 59a. That is, the upper end of the lower preliminary silicide layer 59a may protrude from the upper end of the lower filling insulating material 57a. In another embodiment, the upper end of the lower filling insulating material 57a and the upper end of the lower preliminary silicide layer 59a may be at a similar level. For example, the upper ends of some of the plurality of lower filling insulating materials 57a may be located at a higher level than the upper ends of some of the plurality of lower preliminary silicide layers 59a, and the upper ends of others of the plurality of lower filling insulating materials 57a may be located at a higher level than the upper ends of others of the plurality of lower preliminary silicide layers 59a.

Figure 20A:
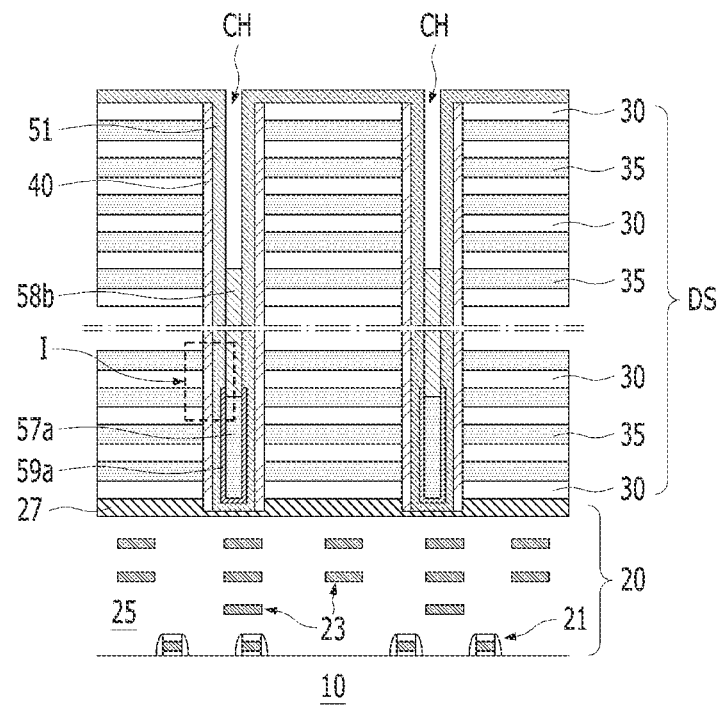
Figure 20B:
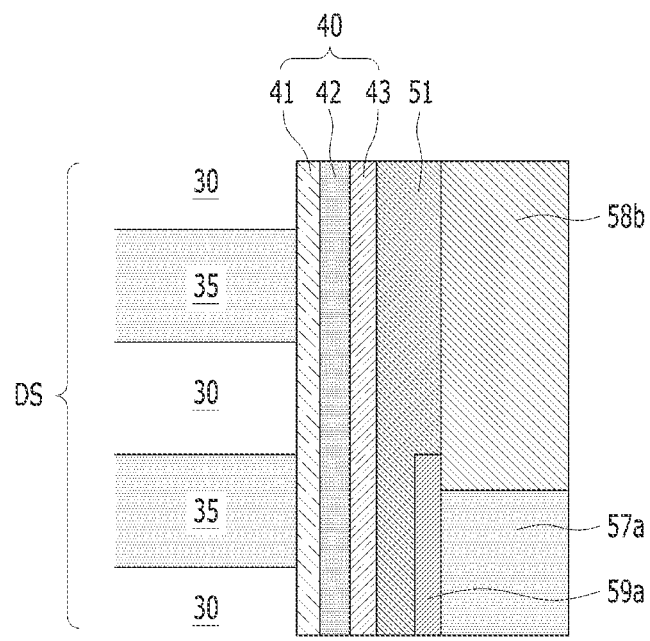

FIG. 20B illustrates an enlarged view of an area I of FIG. 20A. Referring to FIGS. 20A and 20B, the method may further include filling an intermediate filling metal 58b over the lower filling insulating material 57a in the channel hole CH by performing the process described with reference to FIGS. 10A and 10B. A side of a lower portion of the intermediate filling metal 58b may be in contact with a side of an upper portion of the lower preliminary silicide layer 59a. In another embodiment, the lower end of the intermediate filling metal 58b and the upper end of the lower preliminary silicide layer 59a may be spaced apart from each other.

Figure 21A:
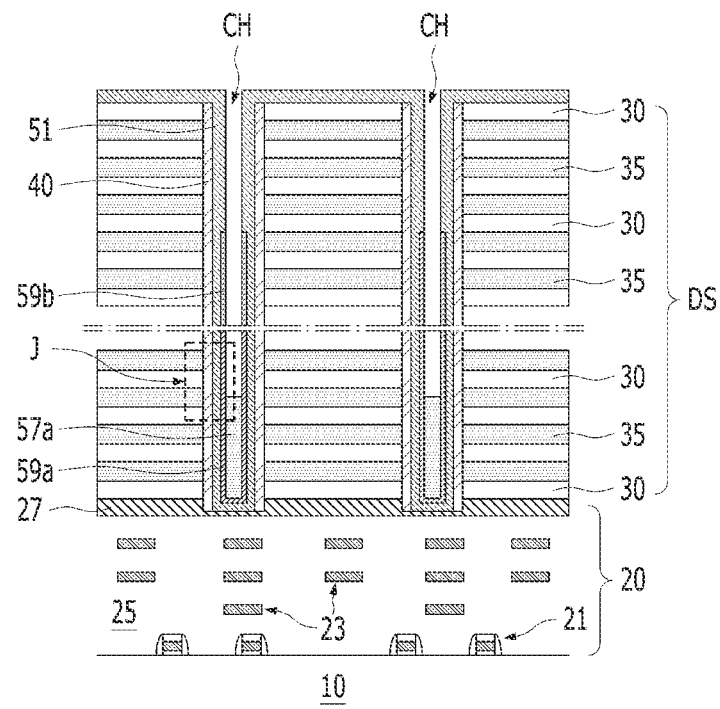
Figure 21B:
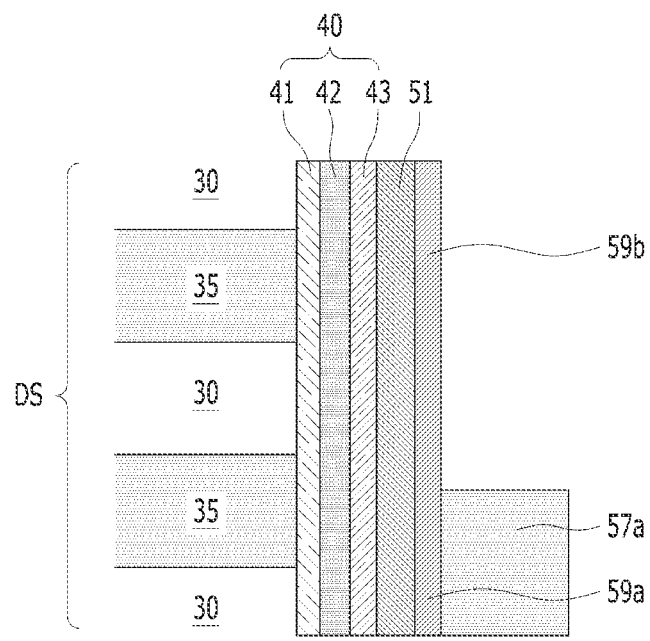

FIG. 21B illustrates an enlarged view of an area J of FIG. 21A. Referring to FIGS. 21A and 21B, the method may further include silicidating a part of an intermediate portion of the silicon channel layer 51 by performing a second preliminary silicidation process. An intermediate preliminary silicide layer 59b may be formed in a part of the intermediate portion of the silicon channel layer 51. The lower preliminary silicide layer 59a and the intermediate preliminary silicide layer 59b may be vertically continuously connected to each other. The method may further include removing the remaining intermediate filling metal 58b after the second preliminary silicidation process is performed.

Figure 22:
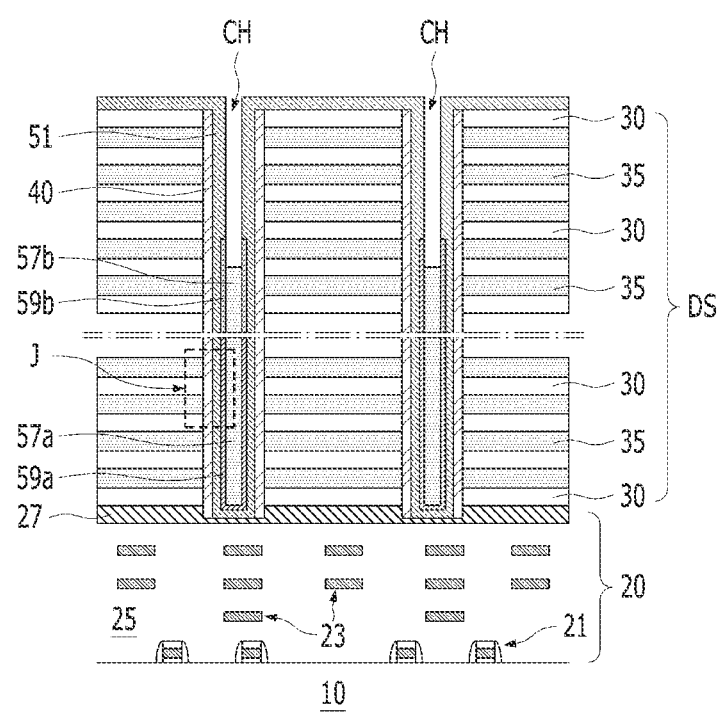

Referring to FIG. 22, the method may further include forming an intermediate filling insulating material 57b in the intermediate region of the channel hole CH from which the intermediate filling metal 58b has been removed. An upper end of the intermediate filling insulating material 57b may be positioned at a lower level than an upper end of the intermediate preliminary silicide layer 59b.

Figure 23:
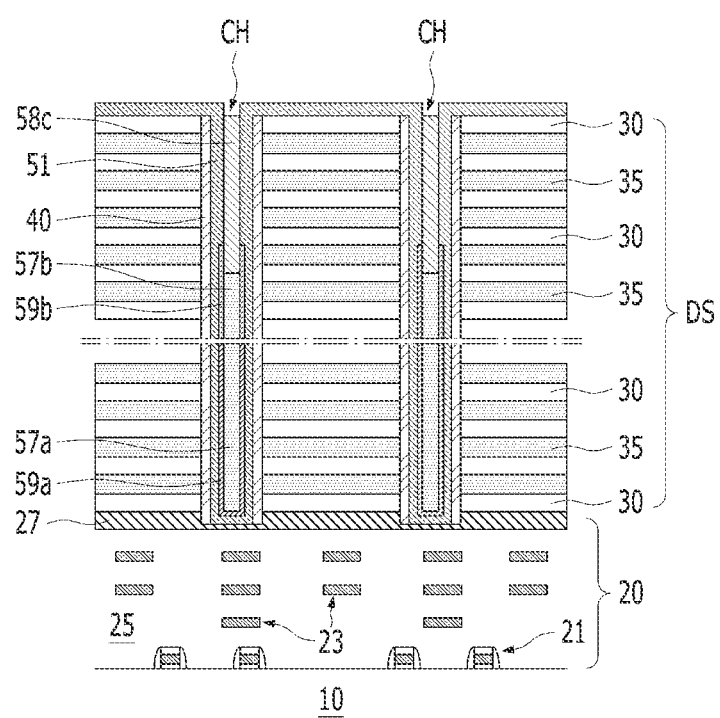

Referring to FIG. 23, the method may further include forming an upper filling metal 58c over the intermediate filling insulating material 57b in the channel hole CH. A side of a lower portion of the upper filling metal 58c may be in contact with a side of an upper portion of the intermediate preliminary silicide layer 59b.

Figure 24:
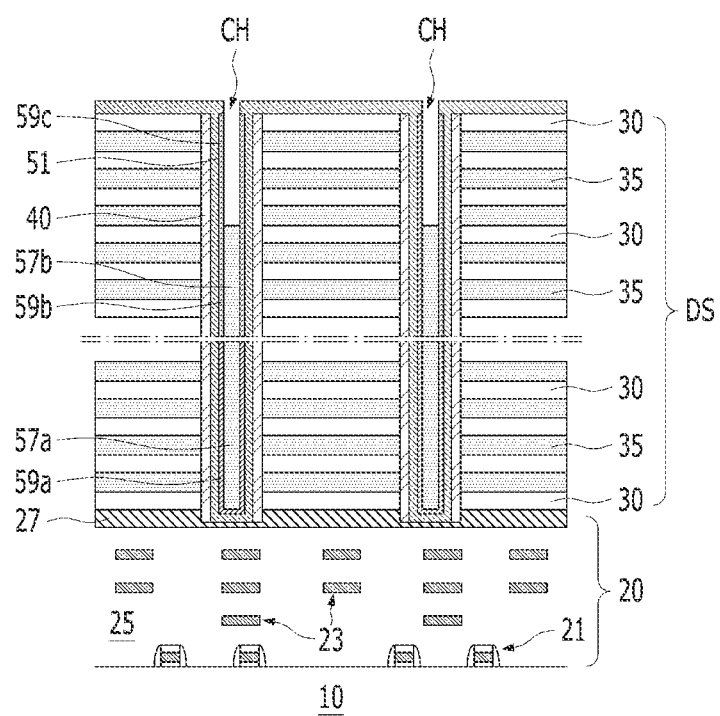

Referring to FIG. 24, the method may further include silicidating a part of an upper portion of the silicon channel layer 51 by performing a third preliminary silicidation process. An upper preliminary silicide layer 59c may be formed in a part of the upper portion of the silicon channel layer 51. The intermediate preliminary silicide layer 59b and the upper preliminary silicide layer 59c may be vertically continuously connected to each other. The method may further include removing the remaining upper filling metal 58c after the third preliminary silicidation process is performed.

Figure 25:
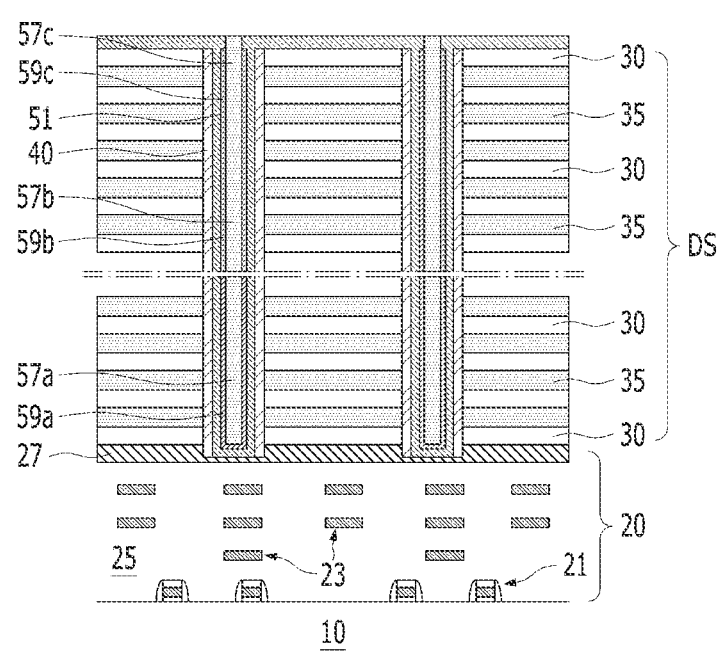

Referring to FIG. 25, the method may further include forming an upper filling insulating material 57c in an upper region of the channel hole CH from which the upper filling metal 58c has been removed. The upper filling insulating material 57c may include the same material as the intermediate filling insulating material 57b.

Figure 26A:
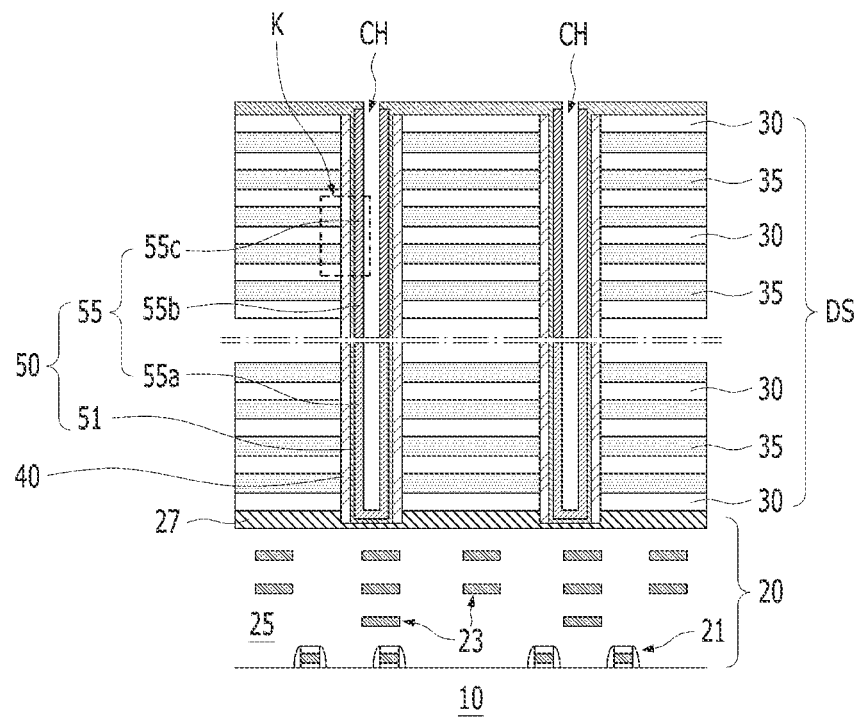
Figure 26B:
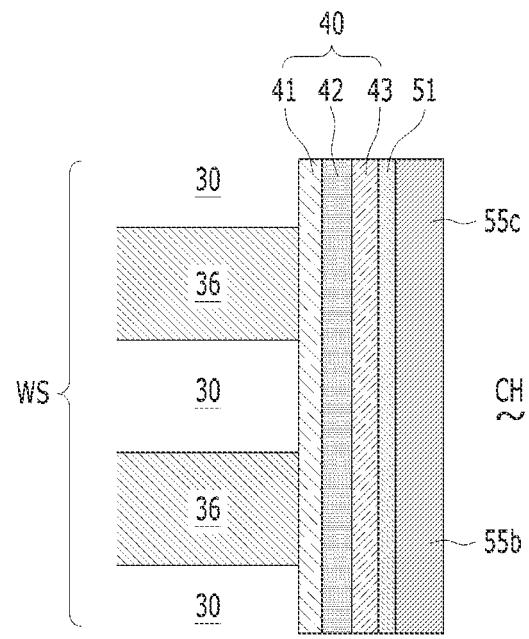

FIG. 26B illustrates an enlarged view of an area K of FIG. 26A. Referring to FIGS. 26A and 26B, the method may further include forming a lower silicide layer 55a, an intermediate silicide layer 55b, and an upper silicide layer 55c by performing a main silicidation process to expand and inflate the lower preliminary silicide layer 59a, the intermediate preliminary silicide layer 59b, and the upper preliminary silicide layer 59c. The lower silicide layer 55a, the intermediate silicide layer 55b, and the upper silicide layer 55c may have volumes greater than the lower preliminary silicide layer 59a, the intermediate preliminary silicide layer 59b, and the upper preliminary silicide layer 59c, respectively. The lower silicide layer 55a, the intermediate silicide layer 55b, and the upper silicide layer 55c may be vertically continuously connected to each other to form a silicide channel layer 55. Accordingly, the silicon channel layer 51 and the silicide channel layer 55 may form a hybrid channel layer 50. Thereafter, the method may further include removing the lower filling insulating material 57a, the intermediate filling insulating material 57b, and the upper filling insulating material 57c inside the channel hole CH.

Figure 27:
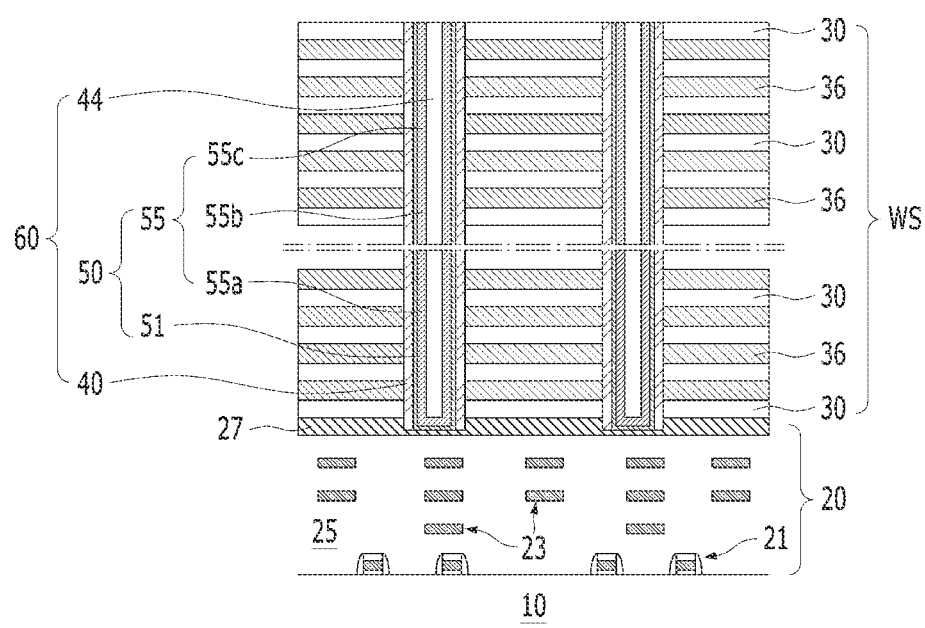

Referring to FIG. 27, the method may further include performing the processes described with reference to FIGS. 17 and 18 to form a core insulating layer 44 to form a vertical channel pillar 60 including the hybrid channel layer 50, and replacing the sacrificial insulating layers 35 with the word lines 36 to form the word line stack WS.

Thereafter, with reference to FIGS. 2A and 2B, the method may further include forming a contact plug 61 vertically aligned with the vertical channel pillar 60 over the word line stack WS and the vertical channel pillar 60, forming a lower interconnection insulating layer 62 surrounding the side surfaces of the contact plug 61, forming a bit line 63 over the contact plug 61, and forming an upper interconnection insulating layer 64 surrounding side surfaces of the bit line 63.

According to the embodiments of the present disclosure, the semiconductor device has the hybrid channel layer, so that resistance of the channel layer may be lowered.

Accordingly, the operation speed of the semiconductor device according to embodiments of the present disclosure may be faster than that of conventional semiconductor devices, and power consumption of the semiconductor device according to embodiments of the present disclosure may be lower than that of conventional semiconductor devices.

Although the present invention has been specifically described according to the above-described preferred embodiments, it should be noted that the above-described embodiments are for the purpose of explanation and not for the limitation thereof. In addition, it will be appreciated by the person having ordinary skill in the art that various modifications of the described embodiments and other embodiments are possible within the scope of the present invention.

What is claimed is:

1. A semiconductor device comprising:
   a word line stack over a substrate, the word line stack including a plurality of interlayer insulating layers and a plurality of word lines alternatively stacked; and
   a vertical channel pillar passing through the word line stack,
   wherein the vertical channel pillar comprises:
   a core insulating layer;
   a hybrid channel layer surrounding the core insulating layer; and
   a memory layer surrounding a side surface of the hybrid channel layer,
   wherein the hybrid channel layer includes:
   a silicide channel layer having a ring shape or cylinder shape surrounding an outer side surface of the core insulating layer; and
   a silicon channel layer surrounding an outer side surface of the silicide channel layer;
   wherein the silicide channel layer is spaced apart from the memory layer not to be in contact with the memory layer.

2. The semiconductor device of claim 1, wherein the silicide channel layer is embedded in an inner wall of the silicon channel layer.

3. The semiconductor device of claim 2, wherein a first part of the silicide channel layer is embedded in the silicon channel layer, and a second part of the silicide channel layer is embedded in the core insulating layer.

4. The semiconductor device of claim 1, wherein the silicide channel layer includes a plurality of silicide channel layers vertically spaced apart from each other.

5. The semiconductor device of claim 1, wherein the silicon channel layer is disposed between the memory layer and the silicide channel layer, wherein the memory layer and the silicide layer are not be in contact with and spaced apart from each other.

6. The semiconductor device of claim 1, wherein the silicide channel layer includes at least one of a palladium silicide, a nickel silicide, and an aluminum silicide.

7. The semiconductor device of claim 1, further comprising:
   a common electrode layer over the substrate,
   wherein:
   the word line stack is disposed over the common electrode layer, and
   the vertical channel pillar is electrically connected to the common electrode layer.

8. The semiconductor device of claim 1, wherein the silicon channel layer is not in contact with the core insulating layer.

9. The semiconductor device of claim 1, wherein the silicon channel layer is not discrete by the silicide channel layer.

10. A semiconductor device comprising:
    a common electrode layer over a substrate;
    a word line stack over the common electrode layer, the word line stack including a plurality of interlayer insulating layers and a plurality of word lines alternatively stacked; and
    a vertical channel pillar vertically passing through the word line stack to be electrically connected with the common electrode layer,
    wherein the vertical channel pillar comprises:
    a core insulating layer having a pillar shape;
    a silicide channel layer with a ring shape or a cylinder shape to surround an outer side surface of the core insulating layer;
    a silicon channel layer with a cylinder shape to surround an outer surface of the silicide channel layer;
    a memory layer with a cylinder shape to surround an outer surface of the silicon channel layer;
    wherein the silicide layer is spaced apart from the memory layer by the silicon channel layer and not to be in contact with the memory layer.

11. The semiconductor device of claim 10, wherein the silicide channel layer includes a plurality of silicide channel layers vertically spaced apart from each other.

12. The semiconductor device of claim 10, wherein the silicide channel layer is embedded in an inner wall of the silicon channel layer.

13. The semiconductor device of claim 10, wherein a first part of the silicide channel layer is embedded in the silicon channel layer, and a second part of the silicide channel layer is embedded in the core insulating layer.

14. The semiconductor device of claim 10, wherein the silicon channel layer is not in contact with the core insulating layer by the silicide channel layer.

15. The semiconductor device of claim 10, wherein the silicon channel layer is not discrete by the silicide channel layer.

16. A semiconductor device comprising:
    a common electrode layer over a substrate;
    a word line stack over the common electrode layer, the word line stack including a plurality of interlayer insulating layers and a plurality of word lines alternatively stacked; and
    a vertical channel pillar vertically passing through the word line stack to be electrically connected with the common electrode layer,
    wherein the vertical channel pillar comprises:
    a core insulating layer having a pillar shape;
    a silicide channel layer surrounding an outer side surface of the core insulating layer;
    a silicon channel layer surrounding an outer surface of the silicide channel layer;
    a memory layer surrounding an outer surface of the silicon channel layer;
    wherein all portions of the outer surface of the silicide layer are in contact with the silicon channel layer, and not in contact with the memory layer.

17. The semiconductor device of claim 16, wherein all portions of the silicide layer are spaced apart from the tunneling layer by the silicon channel layer.

18. The semiconductor device of claim 16, wherein:
    the silicide channel layer is a ring shape or a cylinder shape, and
    an inner surface of the silicide channel layer is in contact with the core insulating layer.

19. The semiconductor device of claim 16, wherein the silicon channel layer is not in contact with the core insulating layer by the silicide channel layer.

20. The semiconductor device of claim 16, wherein the silicon channel layer is not discrete by the silicide channel layer.

* * * * *